United States Patent

Osakabe et al.

[11] Patent Number: 5,811,805
[45] Date of Patent: Sep. 22, 1998

[54] CHARGED PARTICLE GUIDE APPARATUS AND IMAGE VIEWING APPARATUS FOR CHARGED PARTICLE MICROSCOPE USING THE SAME

[75] Inventors: Nobuyuki Osakabe, Kawagoe; Junji Endo, Sakado; Tetsuji Kodama, Nagoya; Tsuneyuki Urakami, Mori-machi; Hiroshi Tsuchiya; Shinji Ohsuka, both of Hamamatsu, all of Japan

[73] Assignees: Research Development Corporation of Japan, Saitama; Hitachi, Ltd., Tokyo; Hamamatsu Photonics K.K., Shizuoka, all of Japan

[21] Appl. No.: 702,183

[22] Filed: Aug. 23, 1996

[30] Foreign Application Priority Data

Aug. 25, 1995 [JP] Japan .................................. 7-217465

[51] Int. Cl.⁶ .................................................. H01J 37/244
[52] U.S. Cl. .......................................... 250/311; 250/397
[58] Field of Search ..................................... 250/311, 397

[56] References Cited

U.S. PATENT DOCUMENTS

| | | | |
|---|---|---|---|
| 3,885,157 | 5/1975 | Heinemann | 250/440.11 |
| 4,382,182 | 5/1983 | Matsuzaka et al. | 250/311 |
| 4,712,057 | 12/1987 | Pau | 250/311 |
| 4,864,131 | 9/1989 | Rich et al. | 250/306 |
| 5,004,918 | 4/1991 | Tsuno et al. | 250/311 |
| 5,153,434 | 10/1992 | Yajima et al. | 250/311 |
| 5,436,449 | 7/1995 | Takahashi et al. | 250/311 |
| 5,552,602 | 9/1996 | Kakibayashi et al. | 250/311 |

*Primary Examiner*—Bruce Anderson
*Attorney, Agent, or Firm*—McGlew and Tuttle

[57] ABSTRACT

An electron-microscope image viewing apparatus capable of measuring of a moving speed or a vibration frequency of an atomic structure, a magnetic structure, an electric structure or the like of a specimen even when the structure changes at a high rate. The apparatus includes a charged particle source for emitting charged particles, an illuminating electron lens system for illuminating a specimen with a beam of the charged particles, an image magnifying/projecting lens system for magnifying an image of the specimen formed by charged particles scattered upon transmission through the specimen and projecting the magnified image onto an image forming plane, at least one charged particle extracting means provided on the image forming plane of the image magnifying/projecting lens system for taking out the charged particles from a predetermined portion of the charged particle beam projected onto the image forming plane, at least one charged particle detector for detecting the charged particles taken out through the charged particle extracting means, and a signal processing means for processing a signal outputted from the charged particle detector.

20 Claims, 16 Drawing Sheets

BLOCK DIAGRAM OF THE FIRST EMBODIMENT OF THIS INVENTION

BLOCK DIAGRAM OF THE FIRST EMBODIMENT OF THIS INVENTION

SCHEMATIC SECTIONAL VIEW SHOWING A STRUCTURE
OF AVALANCHE PHOTODIODE

BLOCK DIAGRAM OF A CIRCUIT CONFIGURATION OF AN EXAMPLE OF CORRELATOR

FIG. 4 BLOCK DIAGRAM SHOWING ANOTHER EXEMPLARY CIRCUIT CONFIGURATION OF CORRELATOR IN WHICH A PLURALITY OF DELAY CIRCUIT HAVING DIFFERENT DELAY TIMES ARE OPERATED IN PARALLEL

BLOCK DIAGRAM SHOWING ANOTHER EXEMPLARY CIRCUIT CONFIGURATION OF CORRELATOR IN WHICH A SHIFT REGISTER IS EMPLOYED

FIG. 6 SCHEMATIC DIAGRAM FOR ILLUMINATING MEASUREMENT OF A MOVING SPEED OF A MOVING MAGNETIC DOMAIN WALL OF A SPECIMEN BY THE IMAGE VIEWING APPARATUS

VIEWS FOR GRAPHICALLY ILLUSTRATING CHARGED PARTICLE DETECTION SIGNAL AND A CORRELATION SIGNAL

BLOCK DIAGRAM OF THE SECOND EMBODIMENT
OF THIS INVENTION

BLOCK DIAGRAM OF THE THIRD EMBODIMENT
OF THIS INVENTION

BLOCK DIAGRAM OF THE FIFTH EMBODIMENT OF THIS INVENTION

OPERATION WAVE FIGURE OF THE FIFTH EMBODIMENT

BLOCK DIAGRAM OF THE SIXTH EMBODIMENT
OF THIS INVENTION

BLOCK DIAGRAM OF THE SIXTH EMBODIMENT
OF THIS INVENTION

EXPLANATION FIGURE OF THE SIXTH EMBODIMENT

DELAY TIME

EXPLANATION FIGURE OF PRIOR ART

CHARGED PARTICLE GUIDE APPARATUS AND IMAGE VIEWING APPARATUS FOR CHARGED PARTICLE MICROSCOPE USING THE SAME

BACKGROUND OF THE INVENTION

1. Field of the Invention

The present invention relates to a charged particle guide apparatus useful for measurement of dynamic changes in an atomic structure, magnetic structure, electric structure and/or the like of a micro-domain of a specimen. Further, the present invention relates to an image viewing apparatus for viewing a microscopic image which is changing at a high rate and which is generated by a charged particle microscope such as, for example, transmission electron microscope implemented by utilizing the charged article guide apparatus.

2. Description of Related Art

Heretofore, in the measurement of dynamic changes in an atomic structure or the like of a fine region or microdomain of a specimen there has been employed in general a transmission electron microscope such as shown in FIG. 16 of the accompanying drawings. More specifically, referring to the figure, electrons emitted from a charged particle source or electron gun 1 collimated to an electron beam by means of an illuminating electron lens system 2 for illuminating a specimen 3 with the electron beam. An image of the specimen 3 thus formed by electrons undergone scattering upon transmission through the specimen is then magnified by an image magnifying/projecting lens system 4 to be projected onto an image forming plane such as a phosphor screen 5 where the electron image of the specimen is converted into an optical image, which is then recorded with the aid of a television camera 27 and a video tape recorder 28 or the like means.

However with the conventional microscopic image viewing apparatus such as mentioned above, the time-based-or temporal resolution of the moving or changing image which can be measured is limited to a level determined by a frame frequency or rate of a television camera employed for displaying and/or recording the image. As a consequence, the temporal resolution which can be realized in practical applications is limited to several milliseconds or so. In other words, with the conventional apparatus, it is extremely difficult or impossible to observe or view the dynamic change in the atomic, magnetical or electrical structure or domain which takes place at a high speed.

SUMMARY OF THE INVENTION

In the light of the state of the art described above, it is an object of the present invention to provide an apparatus which is capable of measuring easily a moving speed and/or a vibration frequency of an atomic structure, magnetic structure, electric structure or the like domain changing at such a high speed which makes it impossible to measure or view the changing image with the conventional apparatus.

More specifically, it is an object of the present invention to provide a charged particle guide apparatus which is composed of a charged particle source, an lens system and an image magnifying/projecting lens system and which includes a means for extracting a part or portion of the charged particles forming a specimen image at a predetermined position of an image forming plane of the image magnifying/projecting lens system, for thereby eliminating the drawback of the prior art apparatus mentioned hereinbefore.

Another object of the present invention is to provide a viewing apparatus for a charged particle-microscope implemented by using the charged particle guide apparatus mentioned above in which charged particle detectors are provided for detecting the charged particles taken out from the charged particle guide apparatus, wherein cross-correlation between signals outputted from the charged particle detectors disposed at different locations or a power spectrum of the detector output signal of a charged particle detector disposed at a given one location is arithmetically determined or where autocorrelation processing is performed for a plurality of output signals of the charged particle detectors disposed in an array, for thereby making it possible to measure or visualize a concerned structure of a specimen image which changes at a high speed or vibrates at a high frequency.

In view of the above and other objects which will become apparent as the description proceeds, there is provided according to a first general aspect of the present invention a charged particle guide apparatus which includes a charged particle source for emitting charged particles, an illuminating electron lens system for illuminating a specimen with a beam of the charged particles, an image magnifying/projecting lens system for magnifying an image of the specimen formed by the charged particles scattered upon transmission through the specimen and projecting the magnified image onto an image forming plane, and at least one charged particle extracting means provided on the image forming plane of the image magnifying/projecting lens system for taking out the charged particles from a predetermined portion of the charged particle beam projected onto the image forming plane.

In a preferred mode for carrying out the invention, the charged particle extracting means may be constituted by an aperture or through-hole formed in a phosphor screen disposed at the image forming plane.

According to a second general aspect of the present invention, there is provided an image viewing apparatus for viewing an image generated by a charged particle microscope implemented by making use of the charged particle guide apparatus described above, wherein the image viewing apparatus includes at least one charged particle extracting means provided on an image forming plane of the image magnifying/projecting lens system for taking out the charged particles from a predetermined portion of a charged particle beam projected onto the image forming plane, at least one charged particle detector provided in correspondence to the charged particle extracting means for thereby detecting the charged particles taken out through the charged particle extracting means, and a signal processing means for processing a signal outputted from the charged particle detector.

In a preferred mode for implementing the image viewing apparatus described above, a plurality of charged particle extracting means may be provided in the image forming plane, wherein the signal processing means may be so designed as to arithmetically determine cross-correlation between signals outputted from the charged particle detectors provided in one-to-one correspondence with the charged particle extracting means, respectively.

More specifically, the signal processing means may be so designed as to determine a moving speed of a concerned domain or structure of the specimen image on the basis of a time at which a peak makes appearance in the arithmetically determined cross-correlation between the signals outputted from the charged particle detectors and a distance intervening between the charged particle extracting means.

Alternatively, the signal processing means may be so designed as to determine a frequency of vibration of a concerned portion or domain of the specimen image by arithmetically determining cross-correlation between the signals outputted from the charged particle detectors provided in association with a pair of charged particle extracting means, respectively.

Furthermore, the signal processing means may also be so designed as to determine a frequency of vibration of a concerned portion of a specimen image on the basis of a power spectrum of a signal outputted from one charged particle detector provided in association with one charged particle extracting means.

In the image viewing apparatus described above, there may further be provided a deflecting means for deflecting the charged particle beam forming the specimen image as projected by the image magnifying/projecting lens system, a control means for changing controllably magnitude of deflection of the charged particle beam as effected by the deflecting means on a time-serial basis, and an output means for displaying and/or recording the time-serial control of the deflection performed by the control means and result of arithmetic operation executed by the signal processing means in synchronism with each other so that two-dimensional distribution of vibration frequencies of the specimen can visibly be observed.

In a further preferred mode for implementing the image viewing apparatus according to the invention, the charged particle extracting means may be constituted by an aperture or through-hole formed in a phosphor screen disposed at the image forming plane, while the charged particle detecting means may be constituted by an avalanche photodiode disposed at the rear side of the phosphor screen in opposition to the aperture so that a part of the charged particles can impinge onto the avalanche photodiode.

The image viewing apparatus may further includes a means for externally applying stimulus to the specimen electrically, magnetically, thermally or chemically or alternatively by using particles such as photons, atoms or electrons, a means for guiding charged particles scattered by the specimen upon transmission therethrough, and an arithmetic means for arithmetically determining cross-correlation between a signal generated by the stimulus applying means in synchronism with application of the stimulus and an output signal of the charged particle detecting means.

In a further preferred mode for carrying out the invention, the charged particle detecting means may be constituted by a plurality of charged particle detectors disposed in a linear array or alternatively in a two-dimensional array. In that case, the apparatus may further include a means for selecting combinations of output signals of the individual charge particle detectors for arithmetic determination of correlations between the output signals, and a means for displaying the results of the correlations as determined. In this case, correlations between the images generated by the charged particle microscope can be determined with regards to a given position and a time.

With the image viewing apparatus for the charged particle microscope implemented by using the charged particle guide apparatus according to the teachings of the present invention as described above, dynamic behavior of a microregion or domain of a specimen under inspection such as move or shift of contrast of the specimen image as well as a vibration of the domain can be measured or visualized even when such dynamic behavior or change takes place at such a high speed or rate that the conventional apparatus known heretofore such as a charge-storage type television camera could not cope with.

In general, a magnified image of a specimen exhibits contrast, i.e., variation in the intensity of the charged particles in dependence on atomic structure, electric structure and magnetic structure of the specimen. Accordingly, by virtue of the arrangement for extracting or taking out the charged particles forming a part of the specimen image so that these charged particles impinge onto the charged particle detector(s) and amplifying the output signal(s) of the charged particle detector(s), it is possible to convert the contrast of the image into an electric current whose amplitude or level varies as a function of the contrast. By way of example, when a certain or given portion of a specimen vibrates mechanically, magnetically or electrically, the current as detected in that portion of the specimen exhibits vibration. Thus, by determining the power spectrum or autocorrelation as mentioned previously, the vibration frequency can be quantitatively evaluated. On the other hand, when a specific structure of a specimen moves, there makes appearance a change in the current outputted from the charged particle detectors upon passing of the structure by the through-holes of small diameter located at different positions, which change can be determined by the contrast of the specific structure. By determining arithmetically the cross-correlation between the output signals of the charged particle detectors, it is possible to determine a time taken for the specific structure to pass by the two small through-holes. On the basis of the time mentioned above and the inter-hole distance, the moving speed of the specific speed can be determined.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

Figure 1:
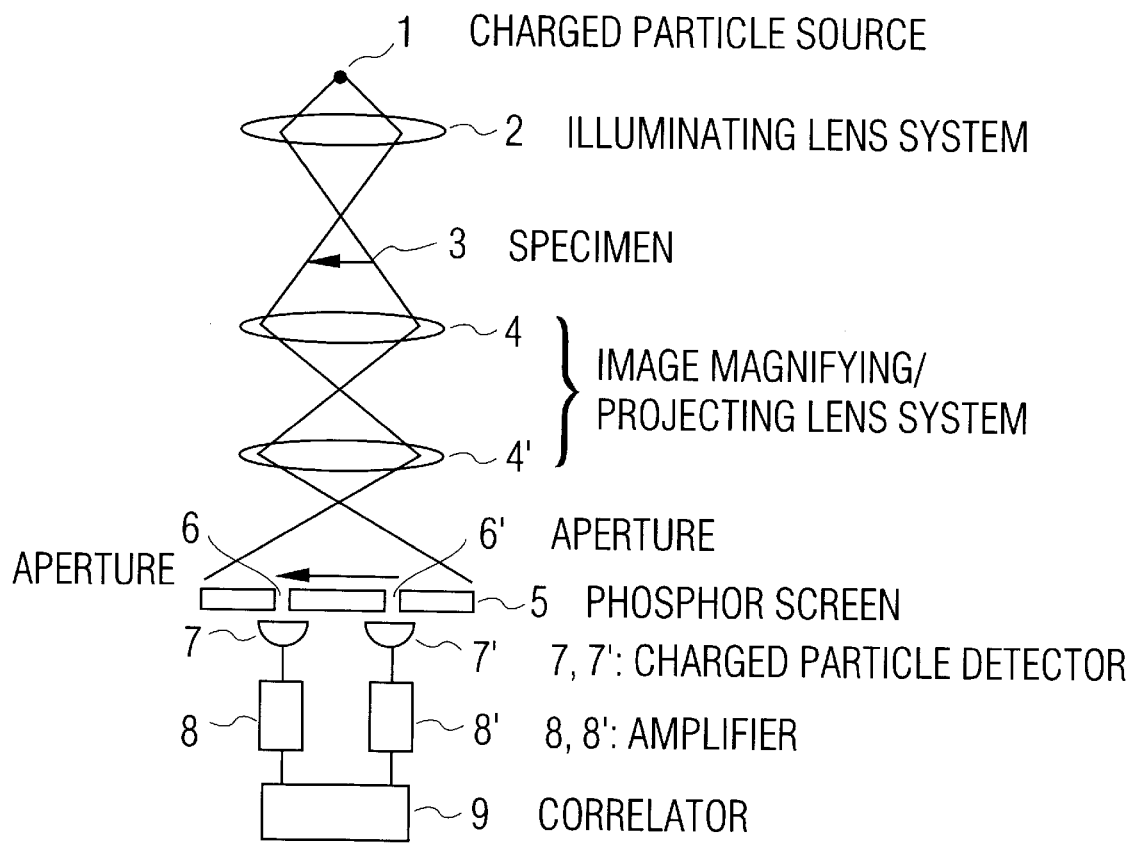
FIG. 1 is a schematic diagram showing generally a structure of a viewing apparatus for a charged particle microscope implemented by using a charged particle guide apparatus according to a first embodiment of the present invention.

Now, the present invention will be described in detail in conjunction with what is presently considered as preferred or typical embodiments thereof by reference to the drawings. In the following description, like reference characters designate like or corresponding or functionally equivalent parts throughout the several views.

Embodiment 1

FIG. 1 is a schematic diagram showing generally a structure of an image viewing apparatus for a charged particle microscope implemented such as a transmission electron microscope which is according to a first embodiment of the present invention. Referring to the figure, a charged particle beam such as an electron beam emitted from a charged particle source 1 such as typified by an electron gun is focused by means of an illuminating electron lens system 2 into a beam having a size to cover or scan a specimen 3 for irradiation thereof. The charged particles transmitted through the specimen 3 and scattered thereby are projected onto a phosphor screen 5 disposed at an image forming or focal plane of the image magnifying/projecting lens system 4; 4', whereby energy of the charged particles is converted into light by the phosphor screen 5. Thus, a magnified image of the specimen 3 can visibly be generated on a surface of the phosphor screen 5.

A pair of through-hole or apertures 6 and 6' serving as the charged particle extracting means are formed in the phosphor screen 5. Thus, the charged particles as projected onto the phosphor screen 5 impinge through the apertures 6 and 6' onto charged particle detectors 7 and 7' disposed at a rear side of the phosphor screen 5 in opposition to the apertures 6 and 6', respectively. Upon reception of the incident charged particles, the charged particle detectors 7 and 7' generate respective pulse-like output signals, which are then inputted to a correlator 9 after having been amplified by amplifiers 8 and 8', respectively, whereupon correlation between the two signals mentioned above is determined.

Each of the apertures 6 and 6' of the phosphor screen 5 may be provided in the form of a circular through-hole with a small diameter. In this conjunction, it should be mentioned that the capability of visualizing discriminatively changes in a microstructure of the specimen can be more enhanced as the cross-sectional area of the aperture 6; 6' is decreased.

Furthermore, it has been experimentally determined by the inventor of the present application that an avalanche photodiode is advantageously suited for use as the charged particle detector 7; 7'. Conventionally, the avalanche photodiode is used commonly as a photodetector or photosensor and exhibits excellent characteristics such as high-speed response and others, as is well known in the art. Similarly, for the detection of the charged particles, the avalanche photodiode can provide lots of advantages such as negligibly short dead time, high output level owing to avalanche multiplication, implementation in a much reduced size and light weight at low cost and others in addition to the highspeed response mentioned above.

Figure 2:
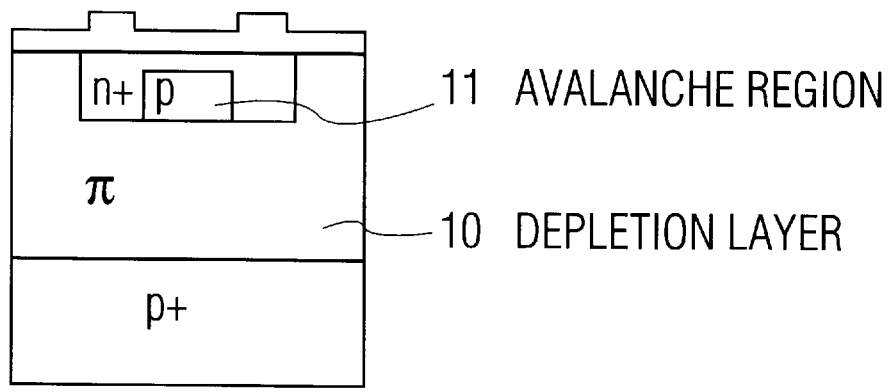
FIG. 2 is a schematic sectional view showing a structure of a typical avalanche photodiode which may be used as a charged particle detector in carrying out the invention.

FIG. 2 is a schematic sectional view showing a structure of a typical avalanche photodiode. As can be seen in the figure, the avalanche photodiode is composed of a π-layer, a p-layer and an $n^+$ formed on a $p^+$-substrate through an epitaxial growth process and impurity doping. In operation of the avalanche photodiode, the π-layer of a low impurity concentration serves as a depletion layer 10 for generating hole/electron pairs by absorbing energy of the incident charged particles, while a region located in the vicinity of the p-layer and the $n^+$-Layer and applied with an electric field of high intensity serves as an avalanche region 11.

Although it has been described above that the charged particle detector is constituted by the avalanche photodiode, it goes without saying that the charged particle detector may be constituted by any other suitable device so far as pulse signals of large amplitude capable of being processed by circuits of the succeeding stages without difficulty can be obtained as the output signal owing to the effect of secondary electron multiplication or the like. By way of example, a channeltron may be employed as the charged particle detector.

On the other hand, the correlator 9 is so designed as to compare the signals outputted from the pair of charged particle detectors 7 and 7' while delaying these signals each by a predetermined time and count frequency of coincidence between the output signals, to thereby arithmetically determine a temporal correlation as a function of the delay time between the signals outputted from the charged particle detectors 7 and 7', respectively. As a means for imparting a temporal difference between the two signals outputted from the charged particle detectors 7 and 7', respectively, a delay circuit may be inserted in a signal path for one of the detector output signals. In this conjunction, it is however preferred that the amount of the delay be variable. To this end, there may be used such variable-delay means as a variable delay circuit, a parallel connection of plural delay circuits having delay times differing from another, a shift register or the like.

Figure 3:
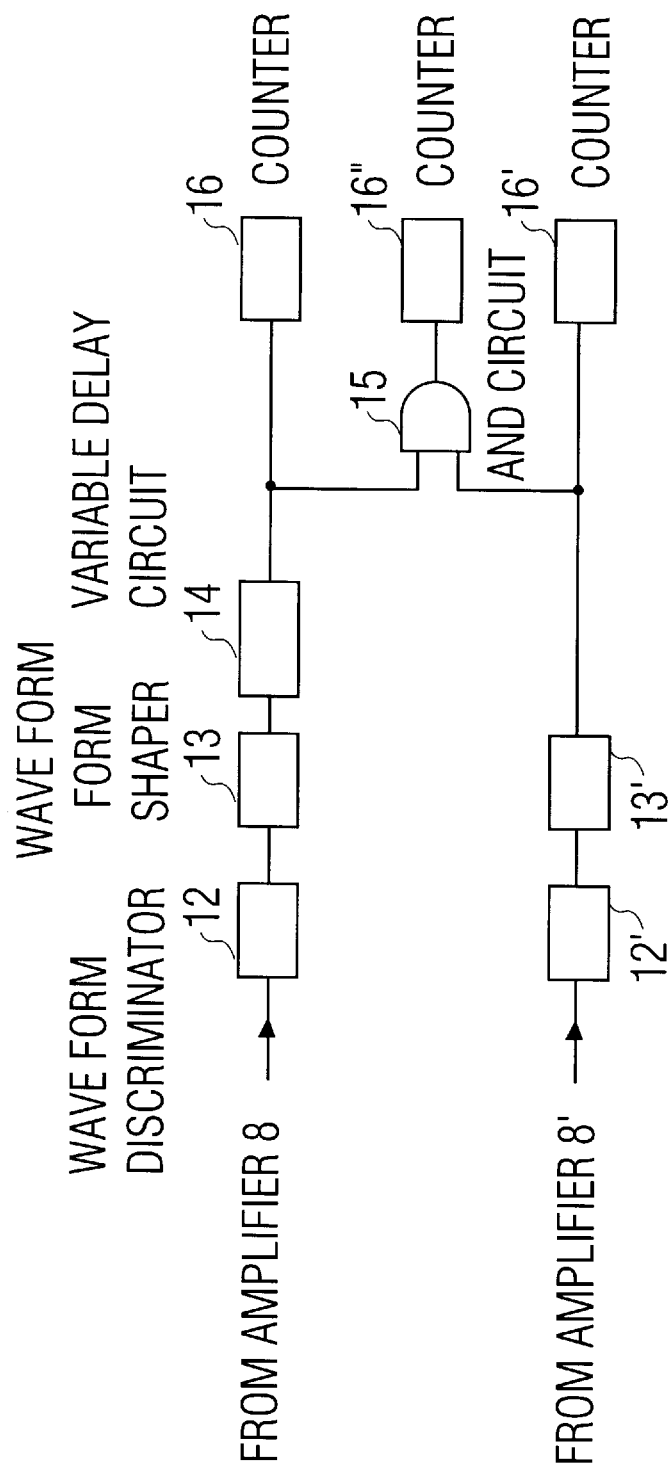
FIG. 3 is a block diagram showing, by way of example, a circuit configuration of a correlator in which a variable delay circuit is employed.

FIG. 3 is a block diagram showing, by way of example, a circuit configuration of the correlator in which a variable delay circuit is employed. Referring to the figure, a pair of signal outputted from the amplifiers 8 and 8', respectively, are inputted to waveform discriminators 12 and 12', respectively. The waveform discriminator 12; 12' serves for separating the detected pulse signal component from noise components contained in the respective input signal. To this end, the waveform discriminator 12; 12' may ordinarily be imparted with a circuit function for slicing the input signal at a predetermined constant threshold level. The pulse output signals generated by the waveform discriminators 12 and 12' are supplied to waveform shapers 13 and 131, respectively, to be shaped in a regular or normalized pulse form pulse-shaped. Of the output pulse signals from the waveform shapers 13 and 13', only the output signal of the waveform shaper 13 is imparted with a predetermined delay by a variable delay circuit 14. Subsequently, the pulse output signal of the waveform shaper 13' and the delayed pulse signal outputted from the variable delay circuit 14 are supplied to associated counters 16 and 16', respectively, and at the same time applied to respective input terminals of a AND logic circuit 15. Thus, the output pulse signal of the charged particle detector 7 which is delayed through the variable delay circuit 14 and the output pulse signal of the charged particle detector 7' undergone no delay are logically ANDed or compared with each other by the AND circuit 15. Upon detection of coincidence between both the input pulse signals, the AND circuit 15 outputs a coincidence pulse signal which is then fed to a counter 16" provided for counting the number of the coincidence indicating pulses. In this manner, the counters 16 and 16' count the output pulses supplied from the charged particle detectors 7 and 7', respectively, wherein the count values derived from the outputs of the charged particle detectors 7 and 7' are utilized for arithmetically determining a cross-correlation value standardized so as to fall between "O" and "1" levels on the basis of the output count value of the counter 16".

The correlator described above by reference to FIG. 3 is however disadvantageous in that the delay time imparted by the variable delay circuit 14 has to be changed periodically at a predetermined time interval for repetitive operation of the variable delay circuit 14, involving shortcoming that the processing time tends to increase. For coping with the problem mentioned above, there is provided according to another embodiment of the present invention a correlator which is constituted by a plurality of delay circuits having mutually different delay times and connected in parallel with one another, as shown in FIG. 4.

Figure 4:
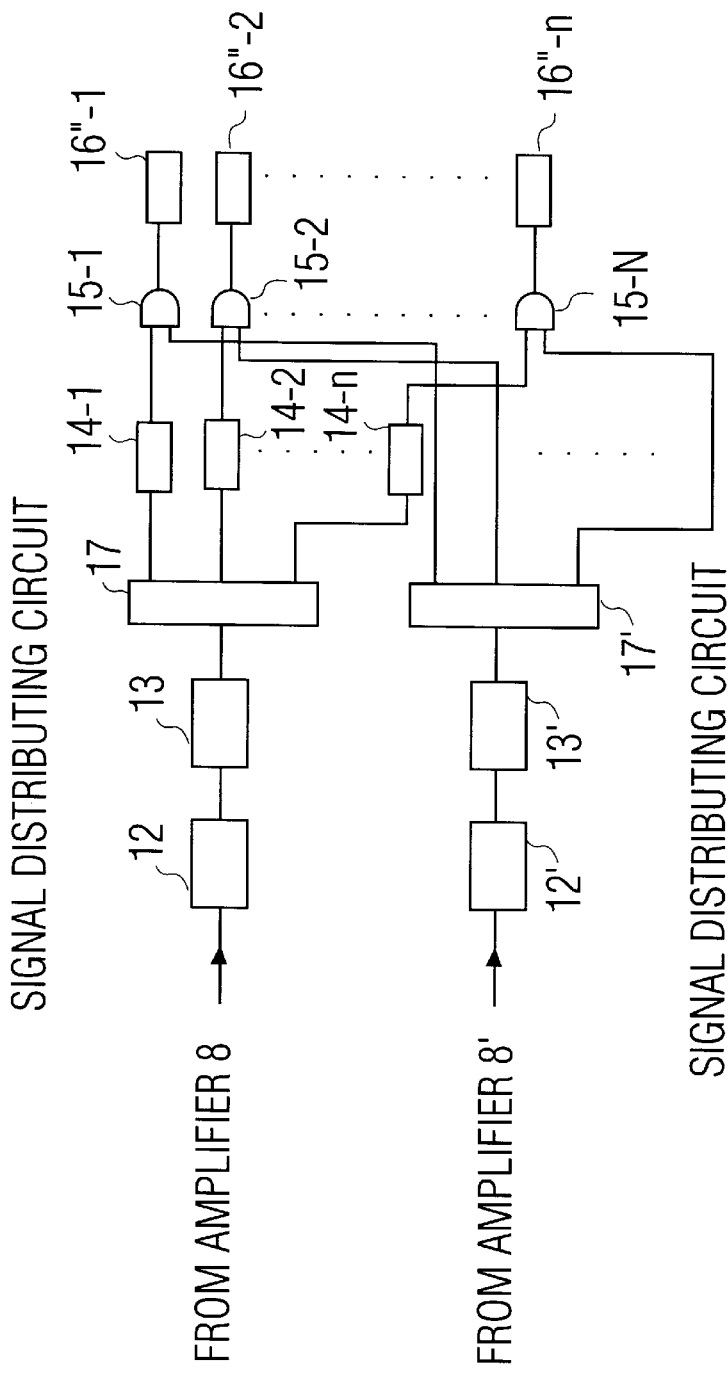
FIG. 4 is a block diagram showing another exemplary circuit configuration of the correlator in which a plurality of delay circuits having different delay times are operated in parallel according to another embodiment of the present invention.

Referring to FIG. 4, the output pulse signals of the waveform shapers 13 and 13' are supplied to the inputs of signal distributing circuits 17 and 17', respectively, whereby each of the output pulse signals of the waveform shapers 13 and 13' is divided into n pulse signals of a same level. The n output pulse signals outputted from the signal distributing circuit 17 are inputted in parallel to n variable delay circuits 14-1, 14-2, . . . , 14-n, respectively, which have respective time delays differing from one another by Δt. The output pulse signals of the variable delay circuits 14-1, 14-2, . . . , 14-n and the n corresponding output pulse signals divided by the signal distributing circuit 17' are inputted to AND circuits 15-1, 15-2, . . . , 15-n, respectively, to be logically ANDed thereby. When coincidence is detected between these input signals, the AND circuits 15-1, 15-2, . . . , 15-n output pulse signals indicative of coincidence, which are then supplied to counters 16"-1, 16"-2, . . . , 16"-n, respectively, whereby counting operations of the coincidence pulses outputted from the AND circuits 15-1, 15-2, . . . , 15-n are performed in parallel with one another.

Thus, the temporal cross-correlation among the output pulse signals of the signal distributing circuits 17 and 17' can arithmetically be determined en bloc or concurrently.

Figure 5:
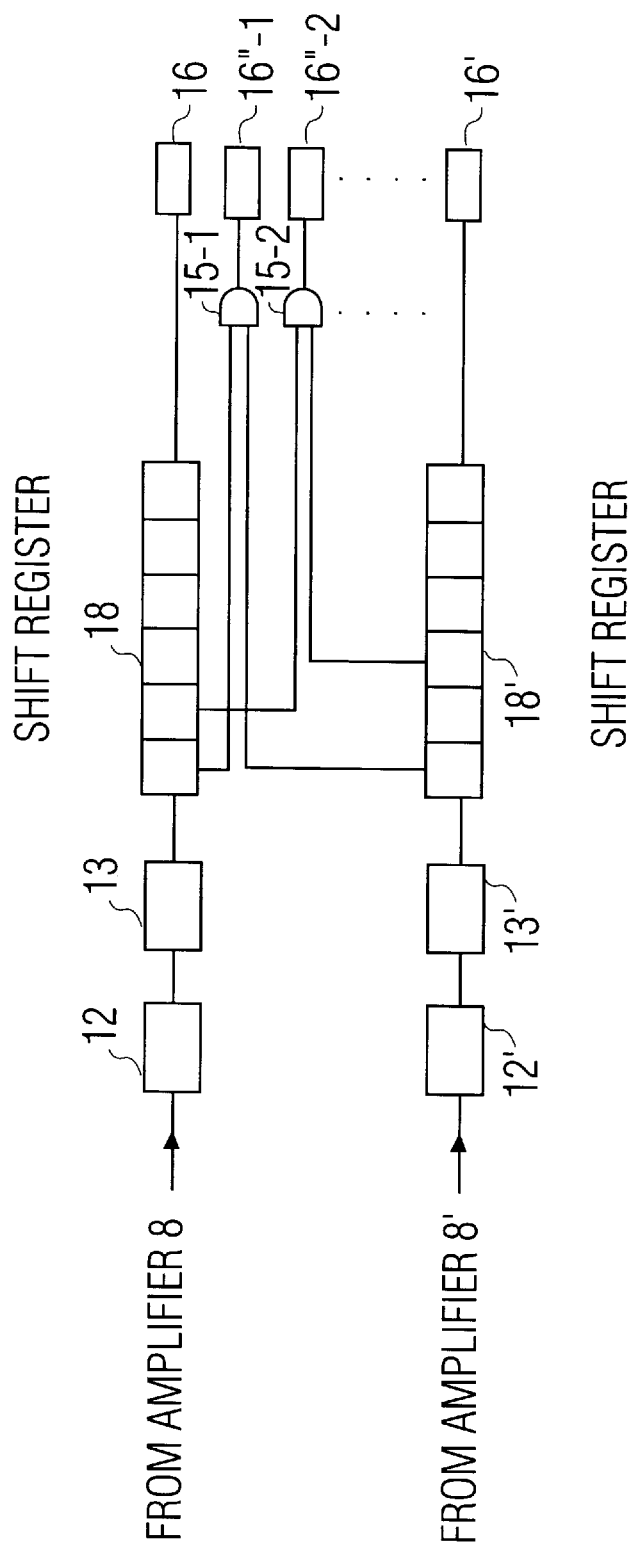
FIG. 5 is a block diagram showing yet another exemplary configuration of the correlator in which a shift register is employed for delay operation according to yet another embodiment of the invention.

FIG. 5 is a block diagram showing correlator according to another embodiment of the present invention in which shift registers are employed for delaying the output pulse signals in parallel, respectively. More specifically, in succession to the waveform shapers 13 and 13', there are provided shift registers 18 and 18' each operating at predetermined clock frequencies, respectively, wherein outputs of individual stages of the shift registers 18 and 18' are supplied as inputs to one terminals of the AND circuits 15-1, 15-2, 15-n, respectively, while the other input terminals of the AND circuits 15-1, 15-2, . . . , 15-n are supplied with outputs from given stages of the shift registers 18 and 18'. In this way, the temporal correlation is arithmetically determined on a parallel basis, as in the case of the correlator shown in FIG. 4. Parenthetically, it should be mentioned that the correlator shown in FIG. 5 is advantageous over the one shown in FIG. 4 in that hardware overhead can be much mitigated or reduced as compared with the correlator configuration shown in FIG. 4.

It should additionally be mentioned that the correlator may be implemented in such configuration as to serve for multiplying analogically the output signals from the pair of detectors. Parenthetically, the cross-correlation arithmetic circuit based on the charged particle counting operation as described above is profitably suited for viewing high-speed movement of the object because high S/N ratio can be ensured even when he signal amplitude or level is very low.

Next, referring to FIG. 6A, description will be made of a measurement performed by using the apparatus implemented in the structure described above. In this measurement, the charged particles were electrons. In the figure, reference numeral 19 denotes a specimen of a magnetic material. As can be seen, by offsetting a focal point of the objective lens system, a magnetic domain wall of the specimen is projected visibly on the phosphor screen 20 in the form of a stripe exhibiting contrast in black (i.e., a region in which the amount of incident electrons is small).

Figure 6:
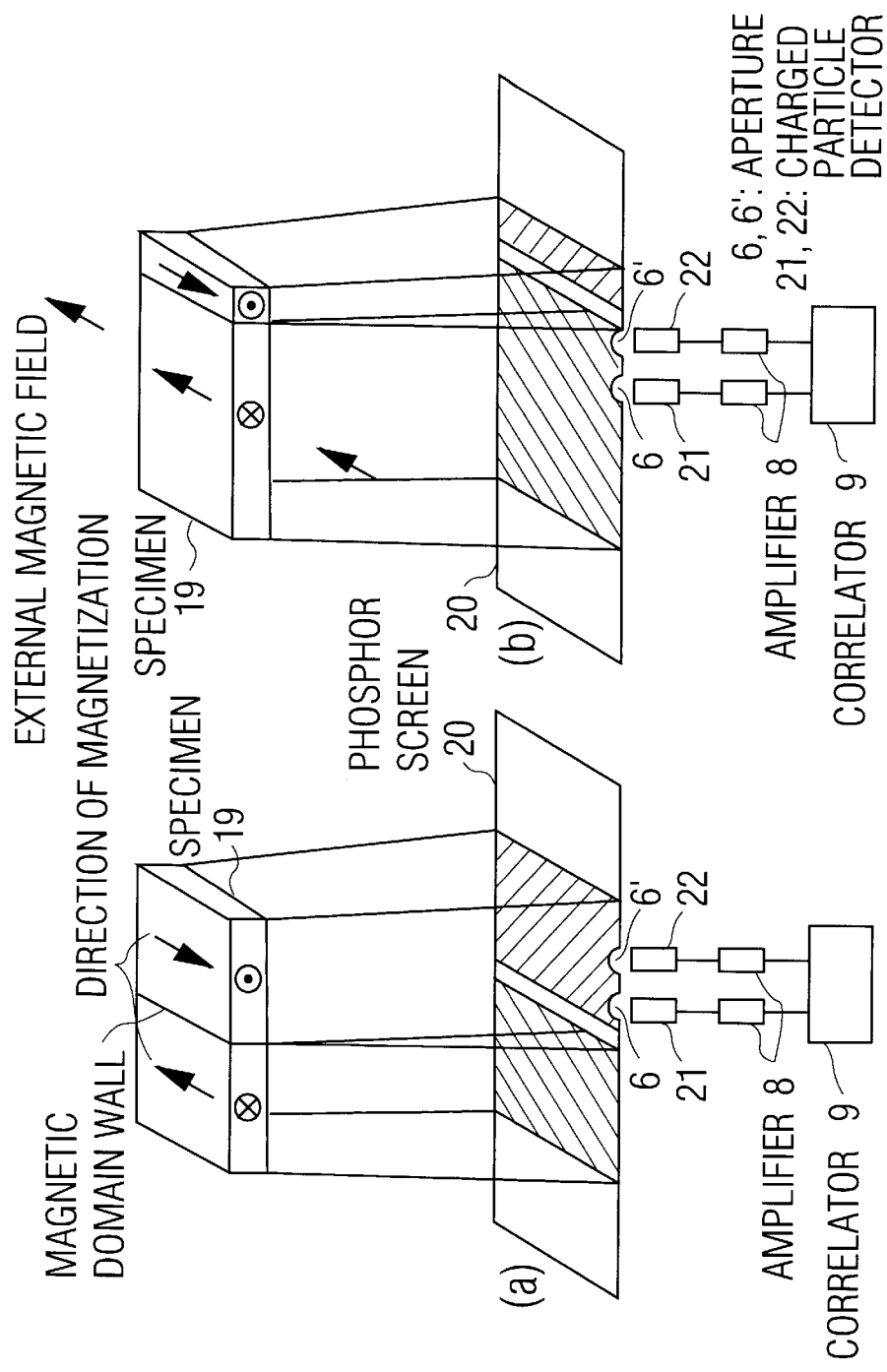
FIGS. 6A and 6B are schematic diagrams for illustrating measurement of a moving speed of a magnetic domain wall of a specimen by the image viewing apparatus according to the invention.

Parenthetically, it should be mentioned that in FIG. 6A, the image magnifying/projecting lens system 4; 4' interposed between the specimen 19 and the phosphor screen 20 is omitted from illustration. When an magnetic field is externally applied, the magnetic domain wall moves in such a manner as illustrated in FIG. 6B, incurring a corresponding change in the magnetic domain structure. It is assumed that the moving speed of the magnetic domain wall is to be measured.

Figure 7:
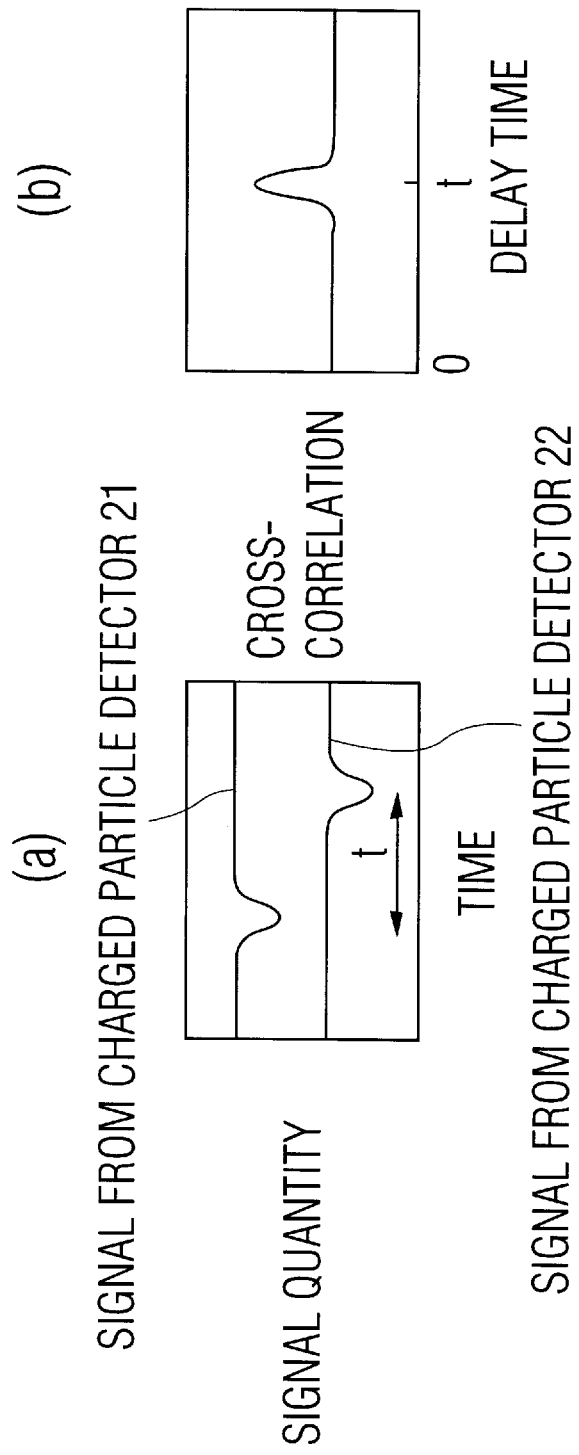
FIGS. 7A and 7B are views for graphically illustrating charged particle detection signals and a correlation signal, respectively, which are obtained in the measurement illustrated in FIGS. 6A and 6B.

FIG. 7A illustrates behavior of the output signals of the paired charged particle detectors 21 and 22, respectively, when the magnetic domain wall moves. As the magnetic domain wall moves, peaks make appearance in the output signals of the charged particle detectors 21 and 22, respectively, in correspondence to the stripe-like contrast in black, as can be seen in FIG. 7A. In order to measure the temporal or time difference between the two peaks, the cross-correlation between the two signals is arithmetically determined with one of the circuit arrangements described previously. In the case of the example shown in FIG. 7A, there makes appearance a peak in the signal obtained through the cross-correlation, as illustrated in FIG. 7B. The moving speed of the magnetic domain wall can be determined as 1/t (where t represents a delay time intervening between a time point at which the signal is detected and a time point at which the peak makes appearance, and 1 represents a distance over which the magnetic domain wall has moved) in terms of the moving speed on the specimen surface by dividing the distance L on the phosphor screen 20 equivalent to the delay time t by the magnification of the image magnifying/projecting lens system 4; 4'. The arithmetic operations involved in the measurement of the moving speed of the black stripe may be automatically carried out by the arithmetic unit which is so implemented as to measure or determine automatically the peak position resulting from the cross-correlation while reading the magnification of the charged particle microscope.

Figure 8:
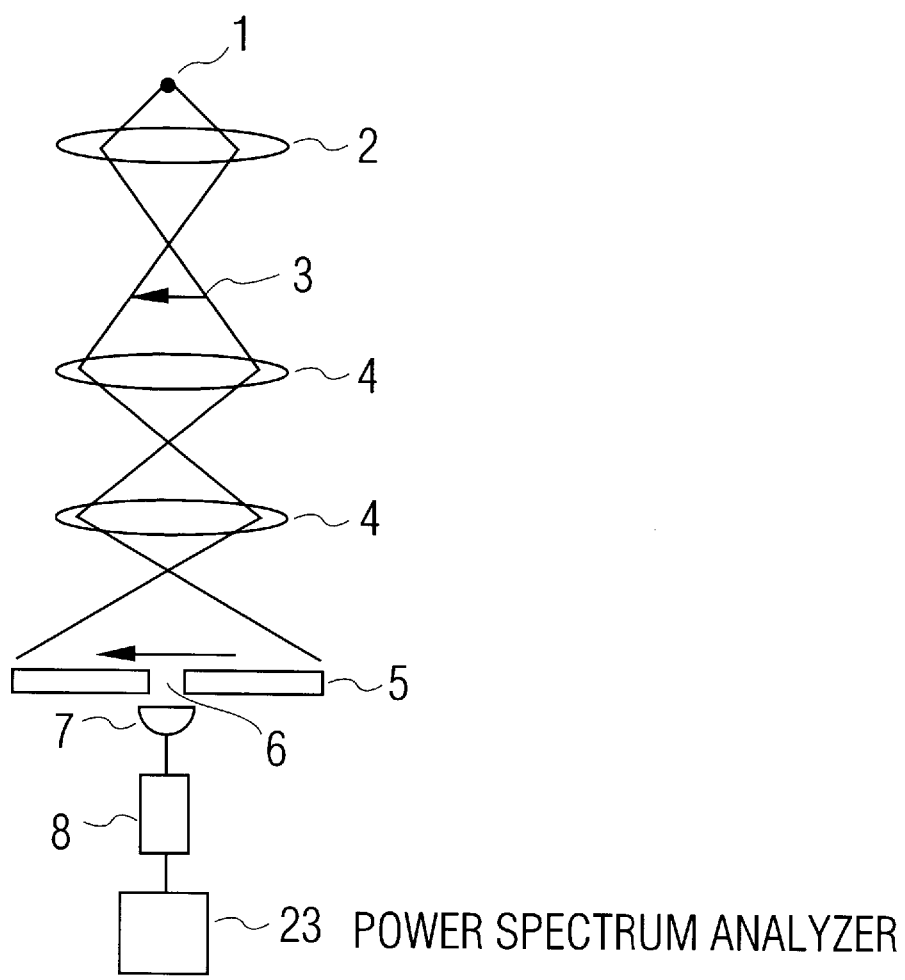
FIG. 8 is a schematic diagram showing generally a structure of a charged particle microscope provided with image viewing facility according to a second embodiment of the present invention.

FIG. 8 is a schematic diagram showing generally a structure of a charged particle microscope according to a second embodiment of the present invention. In the case of the apparatus according to the instant embodiment of the invention, a single through-hole or aperture 6 is provided for extracting the charged particle beam in association with the single charged particle detector 7 disposed in opposition to the aperture 6. By arithmetically determining the power spectrum of the signal outputted from the charged particle detector 7, a vibration frequency of a concerned portion of a specimen 3 can be measured when the specimen portion of concern is vibrating.

Figure 9:
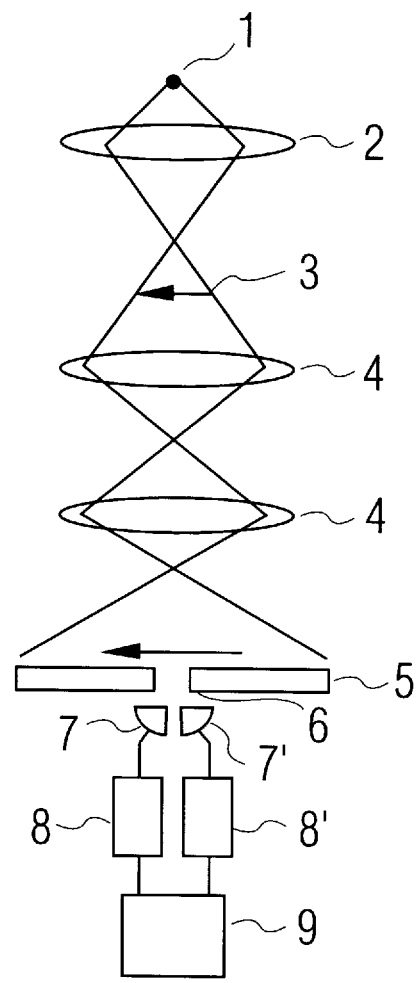
FIG. 9 is a schematic diagram showing a charged particle microscope provided with image viewing facility according to a third embodiment of the present invention.

FIG. 9 is a schematic diagram showing a charged particle microscope according to a third embodiment of the present invention. In the case of the apparatus now under consideration, a single through-hole or 6 is formed in the phosphor screen 5 for taking out a pair of the charged particles, similarly to the apparatus shown in FIG. 8. However, a pair of charged particle detectors 7 and 7' are provided beneath the aperture 6 facing in opposition thereto. With the arrangement shown in FIG. 9, it is possible to measure a vibration frequency of a concerned portion of the specimen by arithmetically determining the cross-correlation between the output signals of the two charged particle detectors 7 and 7'. In this conjunction, it should be noted that the arrangement shown in FIG. 9 is advantageous over the one described hereinbefore by reference to FIG. 8 in that a vibration of higher frequency can be measured with enhanced accuracy because of less influence of dead time of the charged particle detectors 7 and 7'.

Figure 10:
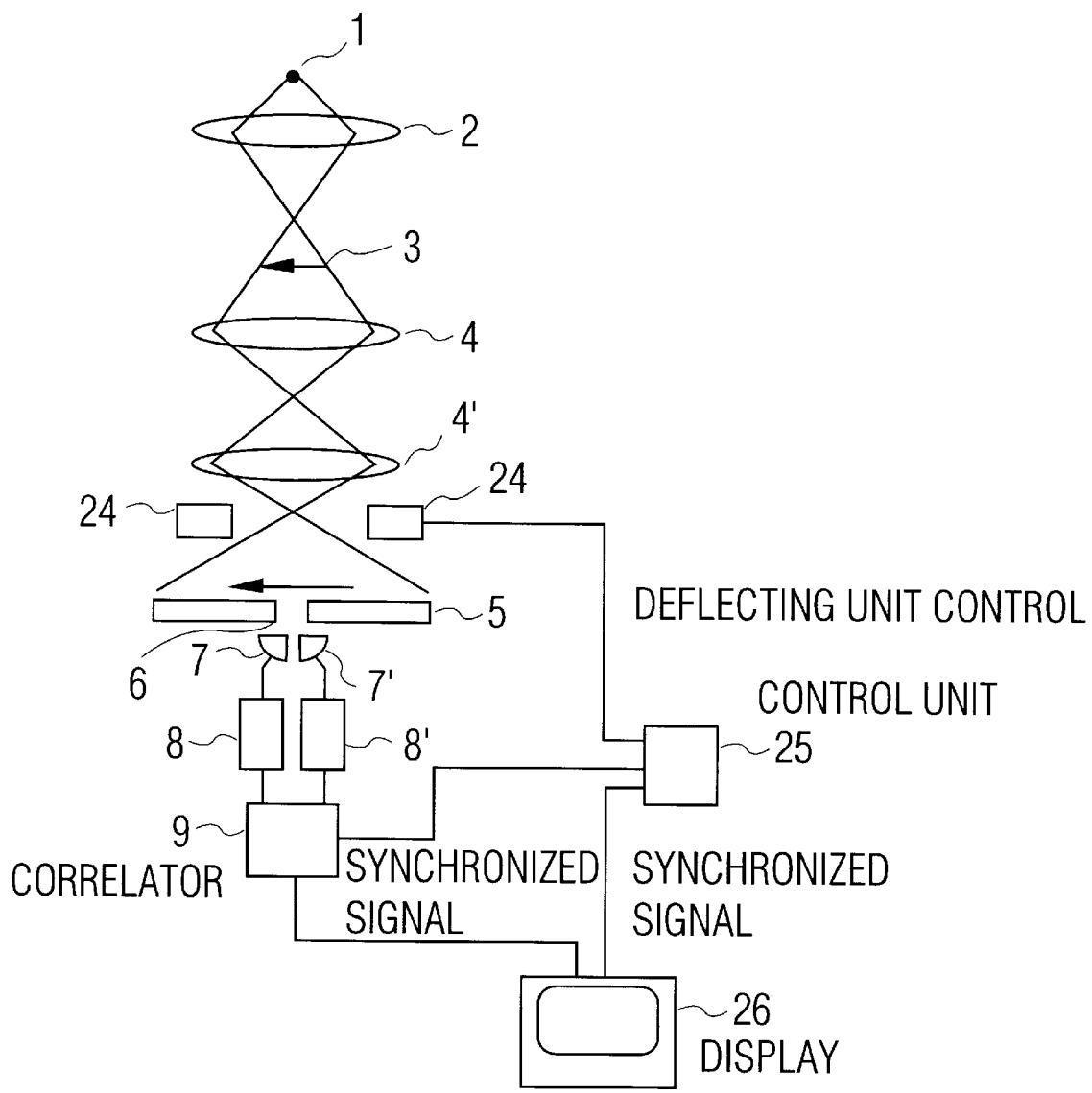
FIG. 10 is a schematic diagram showing generally a structure of a charged particle microscope provided with image viewing facility according to a fourth embodiment of the present invention.

FIG. 10 is a schematic diagram showing generally a structure of the charged particle microscope equipped with the image viewing apparatus according to a fourth embodiment of the present invention. The apparatus shown in FIG. 10 differs from the one shown in FIG. 9 in that there are additionally provided a deflecting unit 24 for deflecting a magnified image of the specimen 3, a control unit 25 for controlling the deflecting unit 24, a correlator 9 which is so designed as to be capable of outputting the result of arithmetic operation in synchronism with a timing for the deflection, and a display/recording unit 26 for displaying and/or recording the result of arithmetic operation outputted from the correlator 9 in synchronism with a synchronizing signal generated by the control unit 25. By virtue of the arrangement of the charged particle microscope, it is possible to scan the image of the specimen to thereby measure the vibration frequencies in different portions of the specimen 3. The result of the measurement can be displayed and/or recorded as two-dimensional information.

Figure 11:
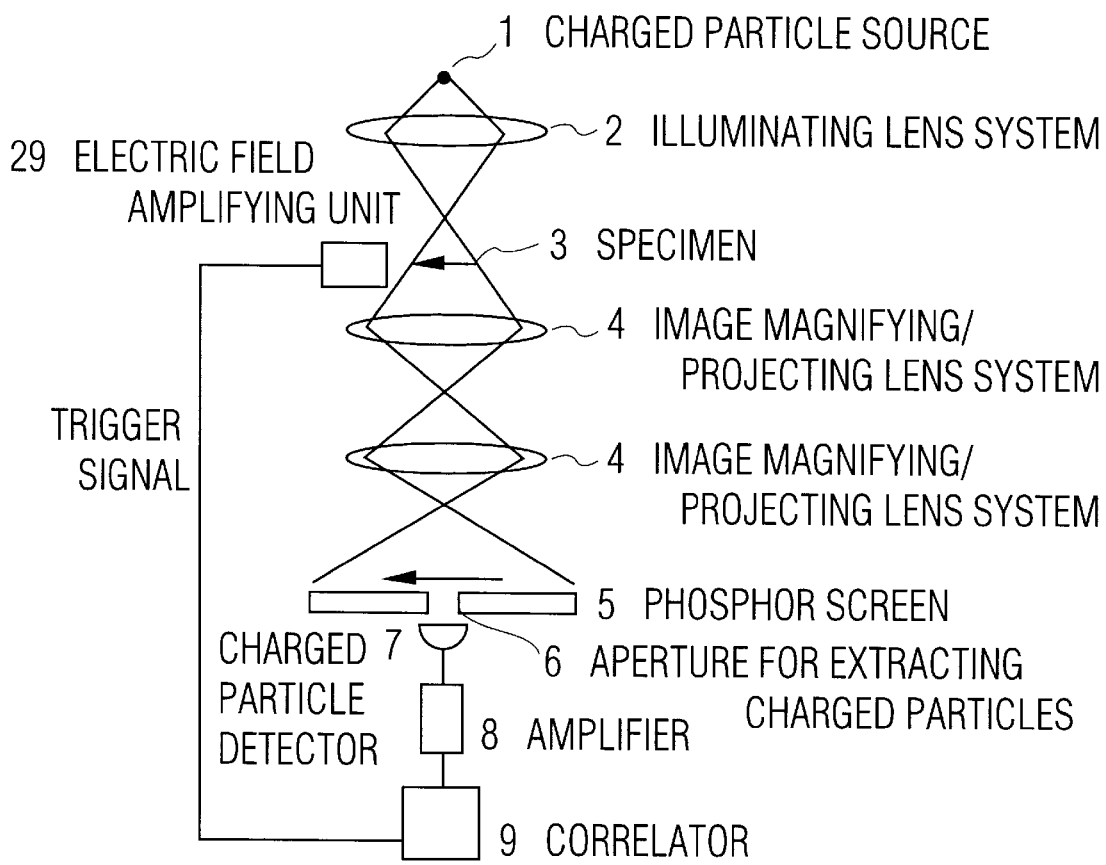
FIG. 11 is a schematic diagram showing generally a structure of a charged particle microscope provided with image viewing facility according to a fifth embodiment of the present invention.

FIG. 11 is a schematic diagram showing generally a structure of the charged particle microscope equipped with image viewing or visualizing facility according to a fifth embodiment of the present invention. The apparatus according to the instant embodiment differs from the second embodiment described previously by reference to FIG. 8 in that an electric field applying unit 29 for applying a pulse-like electric field to the specimen 3 is additionally provided.

When the specimen 3 is of a substance, direction of dielectric polarization changes upon application of the electric field. The rate of the change in the direction of dielectric polarization depends on a primitive mechanism generating the dielectric polarization. In practical applications, measurement of the change of the dielectric polarization is performed for searching or determining a material or substance which exhibits high-speed change of the dielectric polarization, i.e., a material having a high-speed switching capability. With the arrangement according to the instant embodiment of the invention, it is possible to measure the speed or rate of change in the direction of the dielectric polarization.

Figure 12:
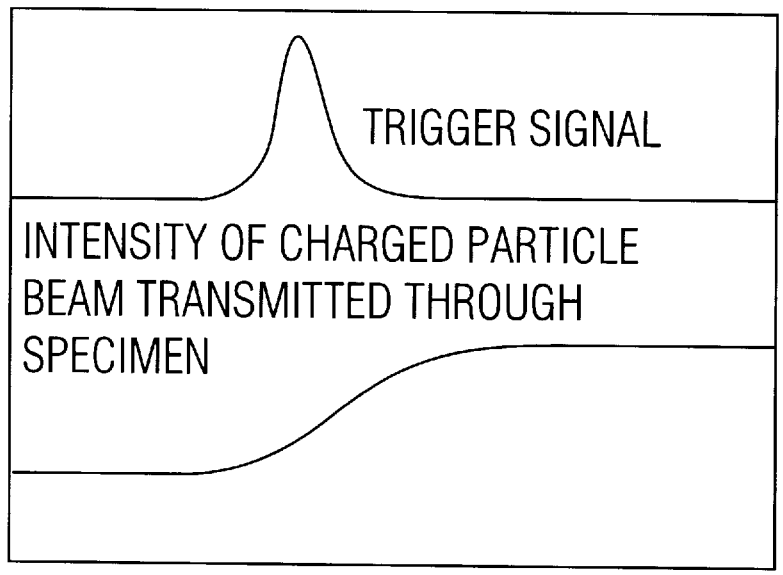
FIG. 12 is a view for graphically illustrating operation of the apparatus according to the fifth embodiment of the invention.

The electric field applying unit 29 provided for applying the electric field in a pulse-like manner to the specimen 3 is so designed as to generate a trigger signal. As can be seen in FIG. 12, a change in the contrast of the specimen image which takes place in accompanying the change in the direction of the dielectric polarization makes appearance in synchronism with the trigger signal in the form of a temporal change (i.e., time-serial change) in the amount of charged particles impinging onto the charged particle detector 7. Such temporal change can be measured by determining arithmetically the cross-correlation between the trigger signal generated by the electric field applying unit 29 and the output signal of the charged particle detector 7.

As a modification of the charged particle microscope shown in FIG. 11, the electric field applying unit 29 for applying electrostatic stimulus may be replaced by an unit or device capable of applying stimulus to the specimen 3 magnetically, mechanically, thermally or chemically or by particles such as photons, atoms, electrons or the like.

Figure 13:
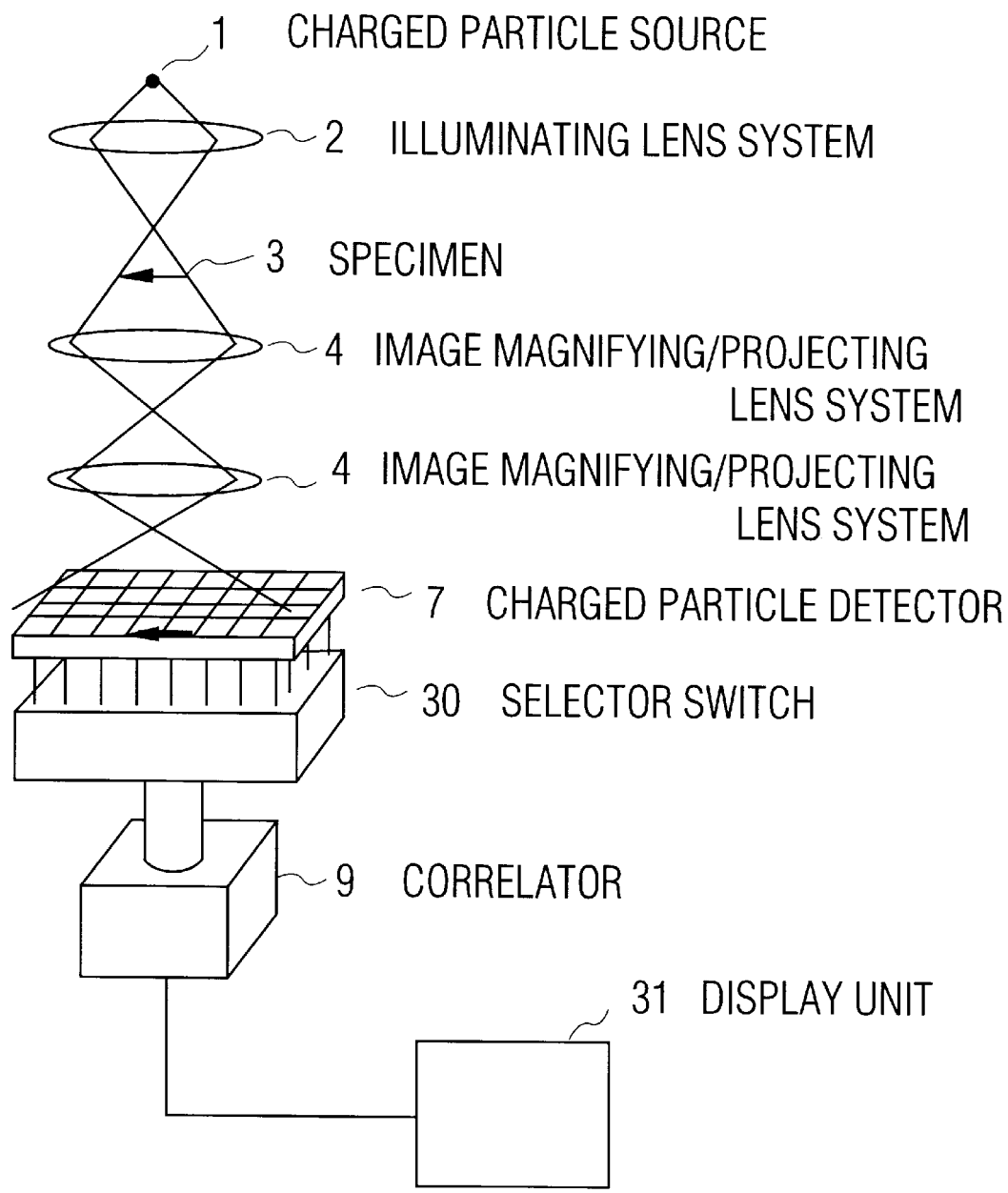
FIG. 13 is a schematic diagram showing generally a structure of a charged particle microscope provided with image viewing facility according to a sixth embodiment of the present invention.

FIG. 13 is a schematic diagram showing generally a structure of the charged particle microscope according to a sixth embodiment of the present invention. The charged particle microscope according to the instant embodiment includes a charged particle detector array 32 composed of a plurality of discrete charged particle detectors 7 disposed on the viewing screen in the form of a two-dimensional array, a correlator 9, a display/recording unit 31, and a selector switch 30 for exchangeably selecting combinations for determining correlation upon inputting of the output signals from the charged particle detectors 7 of the array 32 to the correlator 9. The individual charged particle detectors 7 disposed in the two-dimensional array 32 may be disposed beneath the openings (not shown) formed in the screen 5 in a two-dimensional array in one-to-one correspondence, respectively. Although the two-dimensional array of the charged particle detectors 7 is assumed to be employed in the apparatus illustrated in FIG. 13, it is equally possible to employ a one-dimensional or linear array of the charged particle detectors 7. Furthermore, the linear array or two-dimensional array of the charged particle detectors 7 may be inserted or placed independently at a position where the charged particle image of a specimen is formed, i.e., directly at an imaging position.

Figure 14:
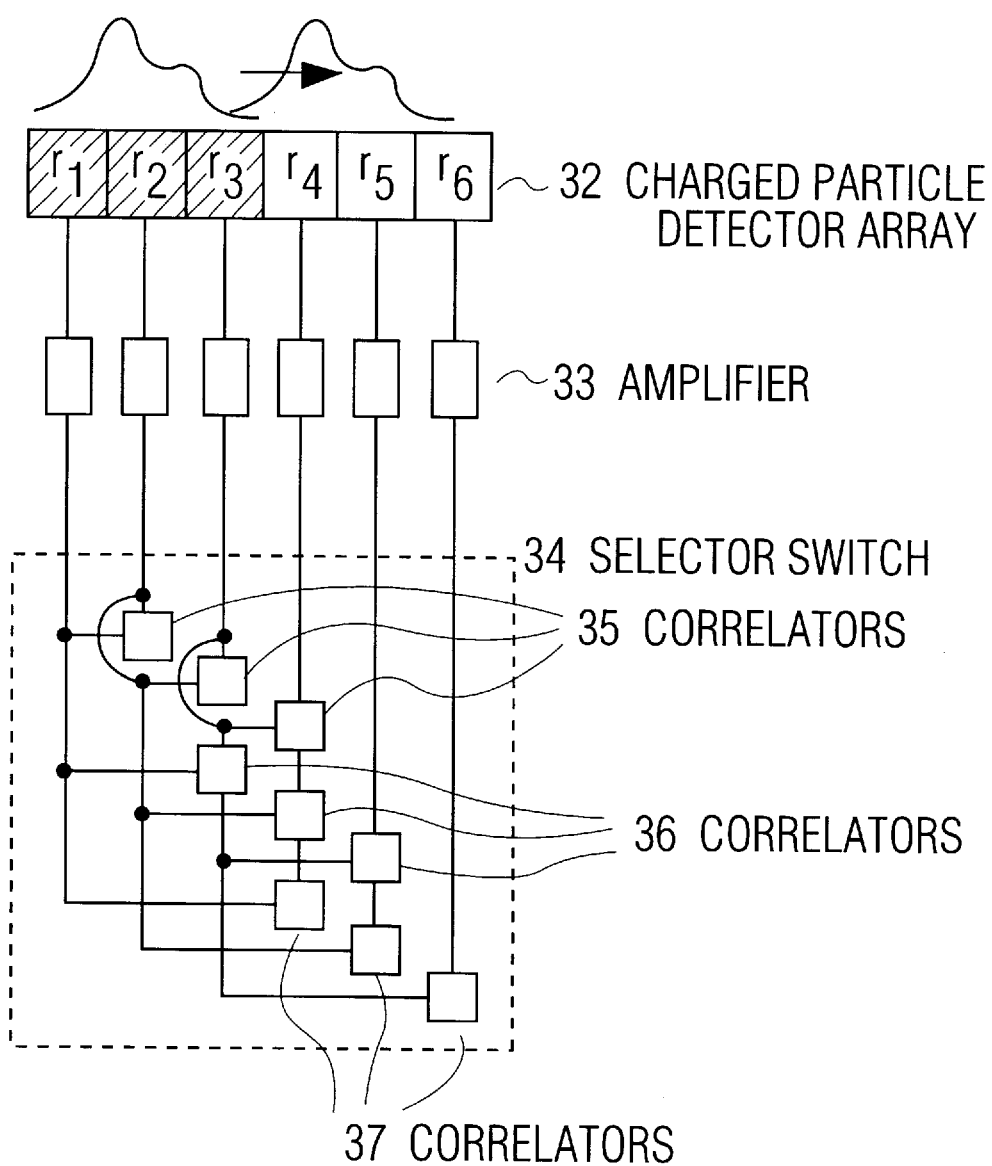
FIG. 14 is a block diagram showing an arrangement of charged particle detectors and correlators employed in the apparatus according to the sixth embodiment of the invention.

Next, description will be made of typical example of measurement based on the correlation of the output signals delivered from the charged particle detectors 7 disposed at plural discrete positions on the viewing plane. FIG. 14 is a schematic diagram showing interconnections of correlators corresponding to a linear charged particle detector array 32.

As can be seen in the figure, it is assumed that there are provided a linear array 32 of six charged particle detectors disposed on an image forming plane of the charged particle microscope, six amplifiers 33 for amplifying the output signals of the charged particle detector arrays 32, respectively, a selector switch 34, and three sets of correlators 35, 36 and 37 each for arithmetically determining cross-correlation between a pair of output signals of the charged particle detectors 7. It is assumed that the specimen image as projected has a contrast such as represented by a waveform shown above the charged particle detectors located at positions $r_1$, $r_2$ and $r_3$, respectively, (see Fig- 14), and that the contrast is caused to move in the direction indicated by an arrow A under stimulus applied externally as mentioned previously. The move of the contrast may be vibration or shift in one direction. It is further assumed that the contrast image moves at such a high speed which makes it impossible to follow it with a charge storage type television camera (known heretofore such as a CCD camera). With the charged particle microscope according to the instant embodiment of the invention however, the move assumed above can be followed up by adopting the correlation arithmetic processing given by the following expression:

$$<i(r_1, t)i(r_{1+n}, t+\tau)>+<i(r_2, t)i(r_{2+n}, t+\tau)>+<i(r_3, t)i(r_{3+n}, t+\tau)>$$

Figure 15:
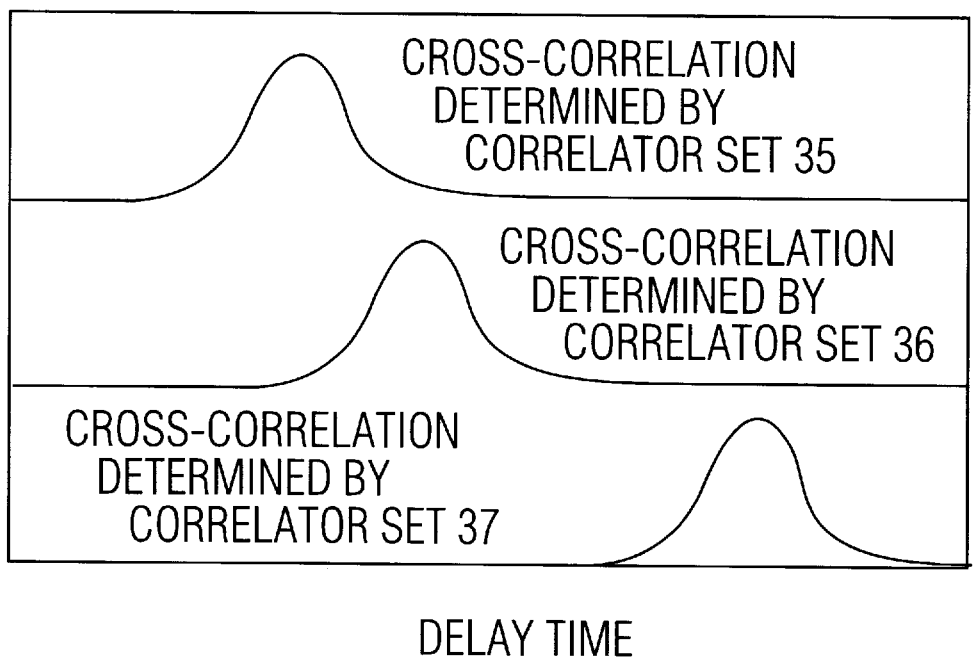
FIG. 15 is a view for graphically illustrating operation of the apparatus according to the sixth embodiment of the invention.
Figure 16:
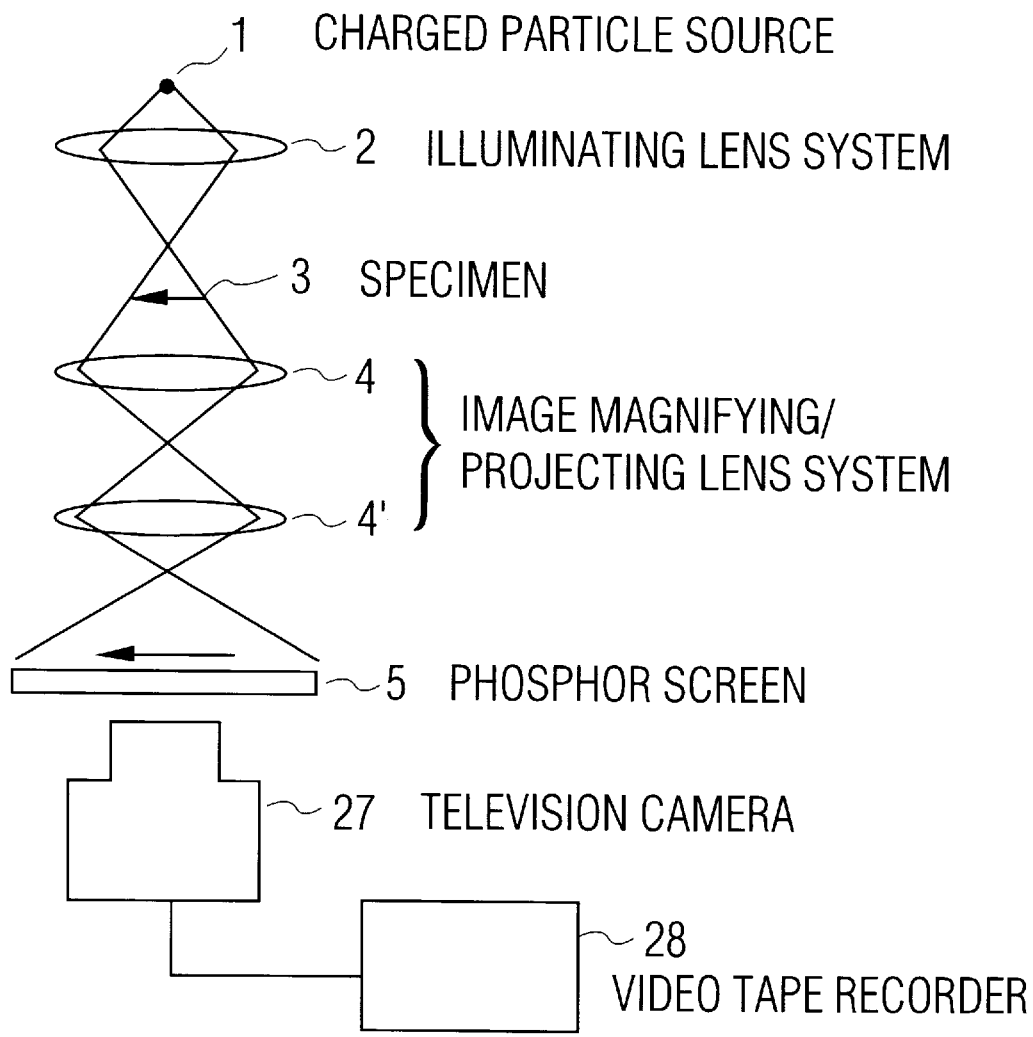
FIG. 16 is a schematic diagram showing an arrangement of conventional transmission electron microscope, a typical one of the charged particle microscope, and an image viewing system known heretofore.

More specifically, correlations are arithmetically determined between the amounts of charged particles impinging onto the charged particle detectors 7 located at $r_1$, $r_2$ and $r_3$, respectively, at a time point t and amounts of charged particles incident to the charged particle detectors 7 located at $r_2$, $r_3$ and $r_4$, $r_3$, $r_4$ and $r_5$, and $r_4$, $r_5$ and $r_6$, respectively, at a time point (t+τ). The result of this arithmetic operation is graphically illustrated in FIG. 15. It can be seen that by displaying three cross-correlations as a function of the delay time τ, move of the object of concern can be followed essentially on a real time basis.

The combinations of the charged particle detectors 7 for arithmetical determination of the cross-correlations will have to be changed in dependence on object of concern. To this end, the selector switch 34 is provided for allowing operator to select the combinations of the charged particle detectors 7 disposed in the linear or two-dimensional array. In this conjunction, it goes without saying that by adopting a two-dimensional array of the charged particle detectors 7, a two-dimensional move of the object of concern can be followed.

As will now be appreciated from the foregoing, it is possible according to the teachings of the present invention to measure or evaluate quantitatively dynamic changes of atomic structure, magnetic structure and electric structure or domain of a micro-region of a specimen.

Many modifications and variations of the present invention are possible in the light of the above techniques. It is therefore to be understood that within the scope of the appended claims, the invention may be practiced otherwise than as specifically described.

What is claimed is:

1. An image viewing apparatus for viewing an image generated by a charged particle microscope which includes a charged particle emission source, an illuminating electron lens system and an image magnifying/projecting lens system, said image viewing apparatus comprising:

at least one charged particle extracting means provided on an image forming plane of said image magnifying/projecting lens system for taking out charged particles from a predetermined portion of a charged particle beam projected onto said image forming plane;

charged particle detector means for detecting the charged particles taken out through said charged particle extracting means;

signal processing means for processing a signal outputted from said charged particle detector means;

said signal processing means includes a correlator; and said signal processing means determines a moving speed of a concerned portion of a specimen image on a basis of a time at which a peak makes appearance in an arithmetically determined correlation between the plurality of signals outputted from said charged particle detector means.

2. An image viewing apparatus for viewing an image generated by a charged particle microscope according to claim 1, wherein:

said charged particle extracting means includes at least one opening formed in a fluorescent screen disposed at said image forming plane, said charged particle detector means including an avalanche diode disposed behind said fluorescent screen in opposition to said opening and counting the charged particles.

3. An image viewing apparatus for viewing an image generated by a charged particle microscope according to claim 1, further comprising:

means for externally applying stimulus to the specimen, said stimulus being one of electrically, magnetically, mechanically, thermally, and chemically exciting and by using a particle selected from a group consisting of a photon, atom and electron;

means for guiding charged particles scattered by said specimen; and arithmetic means for arithmetically determining a correlation between a signal generated by using said stimulus applying means in synchronism with an application of said stimulus and an output signal of said charged particle detector means.

4. An image viewing apparatus for viewing an image generated by a charged particle microscope according to claim 1, wherein;

said charged particle detector means includes a plurality of individual charged particle detectors disposed in one of a linear array and a two-dimensional array;

means is provided for selecting a combination of output signals of said individual charged particle detectors for an arithmetic determination of correlations of said output signals;

means is provided for displaying arithmetic operations determining said correlation, wherein the signal processing means determines the correlation between generated images at a given position and a time.

5. An image viewing apparatus for viewing an image generated by a charged particle microscope according to claim 1, further comprising:

a plurality of said charged particle extracting means provided on said image forming plane of said image magnifying/projecting lens system for taking out the charged particles from a predetermined portion of a charged particle beam projected onto said image forming plane;

a plural of charged particle detectors provided in one-to-one correspondence with said charged particle extracting means for detecting the charged particles taken out through said charged particle extracting means.

6. An image viewing apparatus for viewing an image generated by a charged particle microscope according to claim 5, further comprising:

deflecting means for deflecting a charged particle beam forming the specimen image as projected by said image magnifying/projecting lens system;

control means for controllably changing a magnitude of deflection of said charged particle beam as effected by said deflecting means on a time-serial basis;

output means for displaying/recording results of an arithmetic operation executed by said signal processing means in synchronism with the time serial control of the deflection performed by said control means, wherein two-dimensional distribution of moving velocities of said specimen is visibly observed.

7. An image viewing apparatus for viewing an image generated by a charged particle microscope according to claim 5, further comprising:

means for externally applying stimulus to the specimen, said stimulus being one of electrically, magnetically, mechanically, thermally, and chemically exciting and by using a particle selected from a group consisting of a photon, atom and electron;

means for guiding charged particles scattered by said specimen; and arithmetic means for arithmetically determining a correlation between a signal generated by using said stimulus applying means in synchronism with an application of said stimulus and an output signal of said charged particle detector means.

8. An image viewing apparatus for viewing an image generated by a charged particle microscope according to claim 5, wherein;

said charged particle detector means includes a plurality of individual charged particle detectors disposed in one of a linear array and a two-dimensional array;

means is provided for selecting a combination of output signals of said individual charged particle detectors for an arithmetic determination of correlations of said output signals;

means is provided for displaying a result of the arithmetic operations for determining said correlations, wherein the signal processing means determines the correlation between generated images at a given position and a time.

9. An Image viewing apparatus for viewing an image generated by a charged particle microscope which includes a charged particle emission source, an illuminating electron lens system and an image magnifying/projecting lens system, said image viewing apparatus comprising:

at least one charged particle extracting means provided on an image forming plane of said image magnifying/projecting lens system for taking out charged particles from a predetermined portion of a charged particle beam projected onto said image forming plane;

at least one charged particle detector for detecting the charged particles taken out through said charged particle extracting means;

signal processing means for processing a signal outputted from said charged particle detector;

said signal processing means includes a correlator; and said signal processing means determines a frequency of vibration of a concerned specimen image on a basis of a time at which a peak makes appearance in an arithmetically determined correlation between plural signals outputted from the charged particle detector.

10. An image viewing apparatus for viewing an image generated by a charged particle microscope according to claim 9, further comprising:

deflecting means for deflecting a charged particle beam forming the specimen image as projected by said image magnifying/projecting lens system;

control means for controllably changing a magnitude of deflection of said charged particle beam as effected by said deflecting means on a time-serial basis; and output means for displaying/recording the time-serial control of the deflection performed by said control means and a result of an arithmetic operation executed by said signal processing means in synchronism with each other, wherein two-dimensional distribution of vibration frequencies of said specimen is visibly observed.

11. An image viewing apparatus for viewing an image generated by a charged particle microscope according to claim 9, wherein:

said charged particle extracting means includes at least one opening formed in a fluorescent screen disposed at said image forming plane, said charged particle detector means including an avalanche diode disposed behind said fluorescent screen in opposition to said opening and counting the charged particles.

12. An image viewing apparatus for viewing an image generated by a charged particle microscope according to claim 9, further comprising:

means for externally applying stimulus to the specimen, said stimulus being one of electrically, magnetically, mechanically, thermally, and chemically exciting and by using a particle selected from a group consisting of a photon, atom and electron;

means for guiding charged particles scattered by said specimen; and arithmetic means for arithmetically determining a correlation between a signal generated by using said stimulus applying means in synchronism with an application of said stimulus and an output signal of said charged particle detector means.

13. An image viewing apparatus for viewing an image generated by a charged particle microscope according to claim 9, wherein;

said charged particle detector means includes a plurality of individual charged particle detectors disposed in one of a linear array and a two-dimensional array;

means is provided for selecting a combination of output signals of said individual charged particle detectors for an arithmetic determination of correlations of said output signals;

means is provided for displaying a result of arithmetic operations for determining said correlations, wherein the signal processing means determines a correlation between generated images at a given position and a time.

14. An image viewing apparatus for viewing an image generated by a charged particle microscope according to claim 9, further comprising:

a plurality of said charged particle extracting means provided on said image forming plane of said image magnifying/projecting lens system for taking out the charged particles from a predetermined portion of a charged particle beam projected onto said image forming plane;

a plural of charged particle detectors provided in one-to-one correspondence with said charged particle extracting means for detecting the charged particles taken out through said charged particle extracting means.

15. An image viewing apparatus for viewing an image generated by a charged particle microscope according to claim 14, further comprising:

deflecting means for deflecting a charged particle beam forming the specimen image as projected by said image magnifying/projecting lens system;

control means for controllably changing a magnitude of deflection of said charged particle beam as effected by said deflecting means on a time-serial basis;

output means for displaying/recording results of an arithmetic operation executed by said signal processing means in synchronism with the time serial control of the deflection performed by said control means, wherein two-dimensional distribution of vibration frequencies of said specimen is visibly observed.

16. An image viewing apparatus for viewing an image generated by a charged particle microscope according to claim 14, further comprising:

means for externally applying stimulus to the specimen, said stimulus being one of electrically, magnetically, mechanically, thermally, and chemically exciting and by using a particle selected from a group consisting of a photon, atom and electron;

means for guiding charged particles scattered by said specimen; and arithmetic means for arithmetically determining a correlation between a signal generated by using said stimulus applying means in synchronism with an application of said stimulus and an output signal of said charged particle detector means.

17. An image viewing apparatus for viewing an image generated by a charged particle microscope according to claim 14, wherein;

said charged particle detector means includes a plurality of individual charged particle detectors disposed in one of a linear array and a two-dimensional array;

means is provided for selecting a combination of output signals of said individual charged particle detectors for an arithmetic determination of correlations of said output signals;

means is provided for displaying a result of the arithmetic operations for determining said correlations, wherein the signal processing means determines the correlation between generated images at a given position and a time.

18. An image viewing apparatus for viewing an image generated by a charged particle microscope which includes a charged particle emission source, an illuminating electron lens system and an image magnifying/projecting lens system, said image viewing apparatus comprising:

one charged particle extracting means provided on an image forming plane of said image magnifying/projecting lens system for taking out charged particles from a predetermined portion of a charged particle beam projected onto said image forming plane;

one charged particle detector for detecting the charged particles taken out through said charged particle extracting means;

signal processing means for processing a signal outputted from said charged particle detector;

said signal processing means contains a power spectrum analyzer; and said signal processing means determines a frequency of vibration of a specimen image by arithmetically determining a power spectrum of said signal outputted from said charged particle detector.

19. An image viewing apparatus for viewing an image generated by a charged particle microscope according to claim 18, further comprising:

deflecting means for deflecting a charged particle beam forming the specimen image as projected by said image magnifying/projecting lens system;

control means for controllably changing a magnitude of deflection of said charged particle beam as effected by said deflecting means on a time-serial basis; and output means for displaying/recording results of an arithmetic operation executed by said signal processing means in synchronism with the time serial control of the deflection performed by said control means, wherein two-dimensional distribution of vibration frequencies of said specimen is visibly observed.

20. An image viewing apparatus for viewing an image generated by a charged particle microscope according to claim 18, wherein:

said charged particle extracting means includes at least one opening formed in a fluorescent screen disposed at said image forming plane, said charged particle detector means including an avalanche diode disposed behind said fluorescent screen in opposition to said opening and counting the charged particles.

* * * * *